United States Patent [19]

Weeks et al.

[11] Patent Number: 5,043,543
[45] Date of Patent: Aug. 27, 1991

[54] PROXIMITY SWITCH ASSEMBLY

[75] Inventors: Robert W. Weeks, Lyndhurst; Larry E. Browning, Jefferson, both of Ohio

[73] Assignee: Acme-Cleveland Corporation, Mentor, Ohio

[21] Appl. No.: 451,015

[22] Filed: Dec. 15, 1989

[51] Int. Cl.$^5$ .............. H01H 35/38; G01L 9/10; H01F 27/00; H05K 5/00
[52] U.S. Cl. .................. 200/82 R; 361/179; 361/380
[58] Field of Search ............... 200/82 R, 82 A, 82 C, 200/81.9 R, 81.9 M; 307/116, 118; 361/178, 179, 331, 380

[56] References Cited

U.S. PATENT DOCUMENTS

| | | | |
|---|---|---|---|
| 4,314,310 | 2/1982 | Schmidt | 361/331 |
| 4,419,646 | 12/1983 | Hermle | 307/116 X |
| 4,519,256 | 5/1985 | Daniels | 200/82 A X |
| 4,755,637 | 7/1988 | Turck | 200/82 R |
| 4,785,240 | 11/1988 | Newell et al. | 324/207 |

Primary Examiner—J. R. Scott
Attorney, Agent, or Firm—Pearne, Gordon, McCoy & Granger

[57] ABSTRACT

A proximity switch assembly is provided which has a base with a longitudinal axis. A sensing coil is mounted on the distal end of a probe on a front axial end of the base, and the base is adapted to be mounted to a machine which has a moving part, the position of which relative to the sensing coil is to be determined by the proximity switch. An electrical cable connector is rotatably mounted on the base and may be rotated into a plurality of positions around the axis. Conductors extend between the sensing coil and the electrical cable connector, and at least part are deformed spirally to permit rotation of the cable connector. A series of teeth are on the base and a locking spring moves into engagement with any of the teeth to establish the plurality of locked rotational positions.

21 Claims, 3 Drawing Sheets

PROXIMITY SWITCH ASSEMBLY

BACKGROUND OF THE INVENTION

Proximity switches have been used in a number of situations, especially on machines or machine tools for a non-contact sensing of a position of a movable part of the machine. In complex machines especially, space is at a premium for such proximity switches. The proximity switch assembly has a cable connector, either a disconnectable type or an integral cable type, for the electrical cable supplying power to the proximity switch and with conductors supplying the switch ON or OFF condition. This switch cable connector must be positioned relative to the axis of the proximity switch so that the cable does not interfere with parts of the machine, especially any moving parts of the machine. To this end, a prior art proximity switch assembly was one which had four mounting holes in the base of the assembly, so that the base, and hence the cable connector, could be mounted in any one of four mounting positions at zero, 90 degrees, 180 degrees, and 270 degrees relative to a reference. Thus, the mounting of the proximity switch was limited to these four exact positions.

Another form of proximity switch assembly mounting was proposed in U.S. Pat. No. 4,755,637, wherein supposedly the cable connector could be rotated into an infinite number of positions in a 360-degree circle around the axis. However, the mounting bolts had to be tightened after rotational positioning, and the cable connector had two 90-degree arcs whereat access to the mounting bolts was covered by the cable connector, thus precluding tightening of the mounting bolts.

SUMMARY OF THE INVENTION

The problem to be solved, therefore, is how to construct a proximity switch assembly which may be readily rotated into a number of possible positions of a cable connector relative to the axis of the assembly.

This problem is solved by a proximity switch comprising a base having a longitudinal axis, sensing means mounted non-rotatably on a front axial end of said base, mounting means in said base for securing said base to a machine having a moving part, the position of which relative to said sensing means is to be determined by said proximity switch, an electrical cable connector on said base extending perpendicularly to said axis, conductor means extending between said non-rotatable sensing means and said electrical cable connector, means establishing rotation of said cable connector relative to said base about said axis into a plurality of positions, and at least part of said conductor means being deformed spirally to permit rotation between limits of said cable connector around said axis by tightening or loosening said spiral.

The problem is further solved by a proximity switch assembly comprising, in combination, a base having a longitudinal axis, sensing means mounted on a front axial end of said base, mounting means in said base for securing said base to a machine having a moving part, the position of which relative to said sensing means is to be determined by said proximity switch, an electrical cable connector on said base electrically connected to said sensing means and extending at an angle to said axis, means establishing rotation of said cable connector relative to said base about said axis into a plurality of positions, a series of teeth around said axis and equidistant therefrom, and a locking device movable into engagement with any of said teeth to establish one of a plurality of locked rotational positions of said cable connector relative to said base.

Accordingly, an object of the invention is to provide a proximity switch assembly with a multiplicity of rotational positions of a cable connector around the assembly axis.

Another object of the invention is to provide positive locking means of a plurality of adjustable positions of a cable connector around a proximity switch assembly axis.

Other objects and a fuller understanding of the invention may be had by referring to the following description and claims, taken in conjunction with the accompanying drawing.

DESCRIPTION OF THE PREFERRED EMBODIMENT

Figure 1:
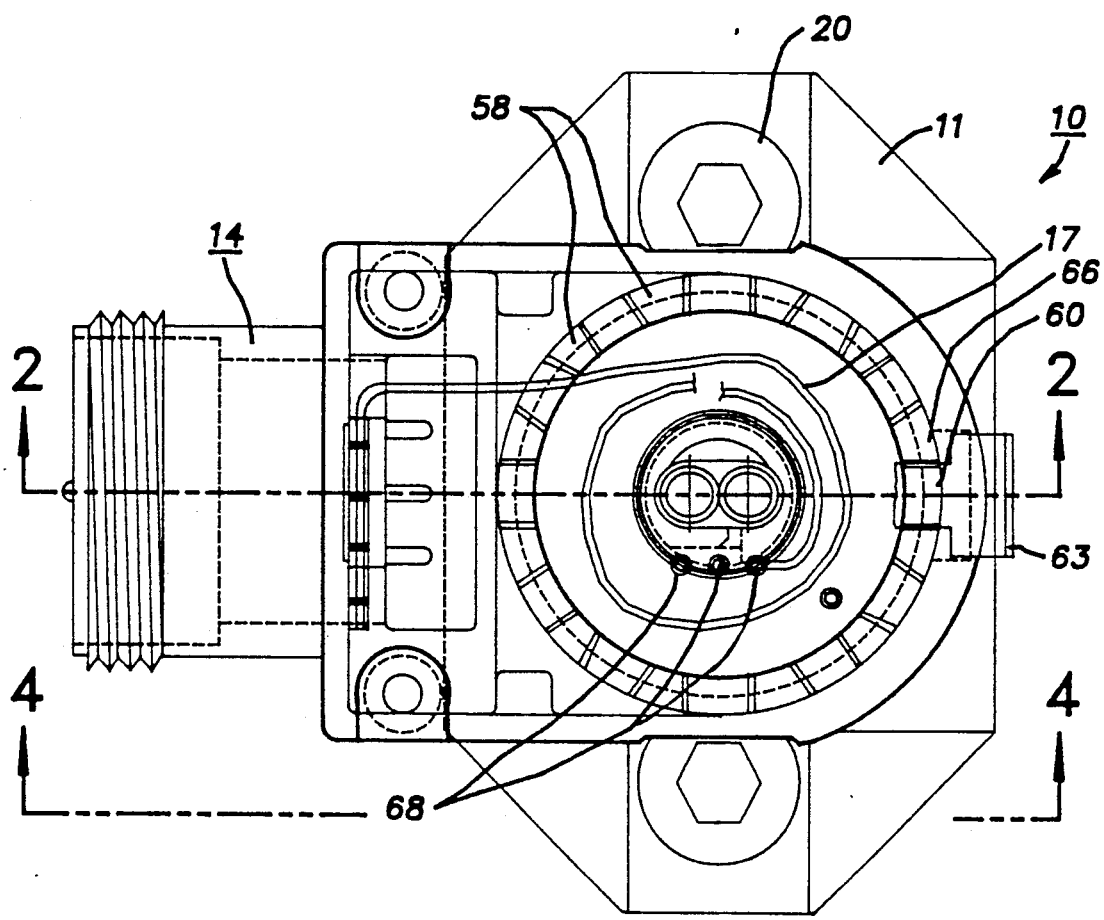
FIG. 1 is a top plan view of a proximity switch assembly embodying the invention.
Figure 2:
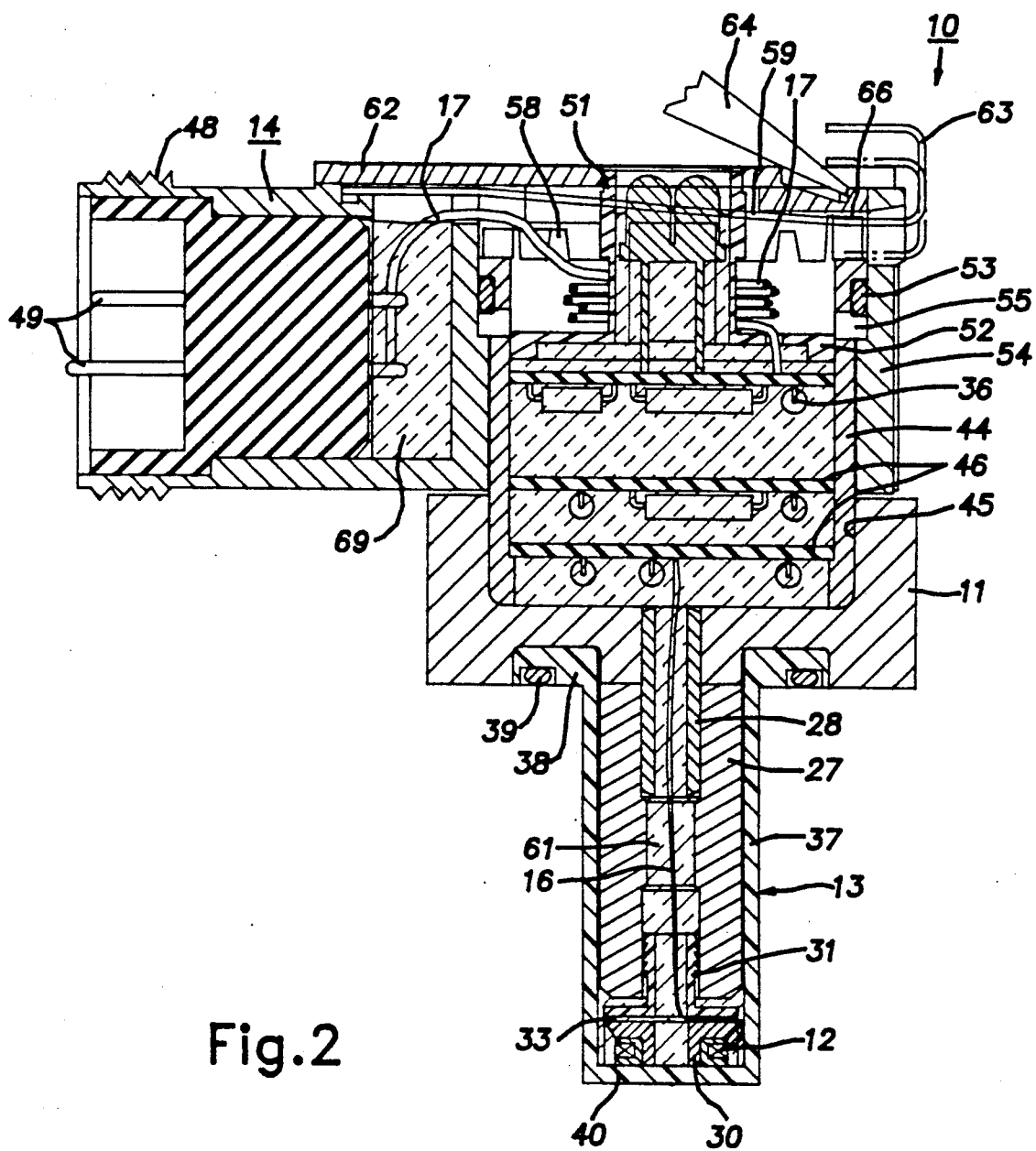
FIG. 2 is an axial sectional view on line 2—2 of FIG. 1.
Figure 3:
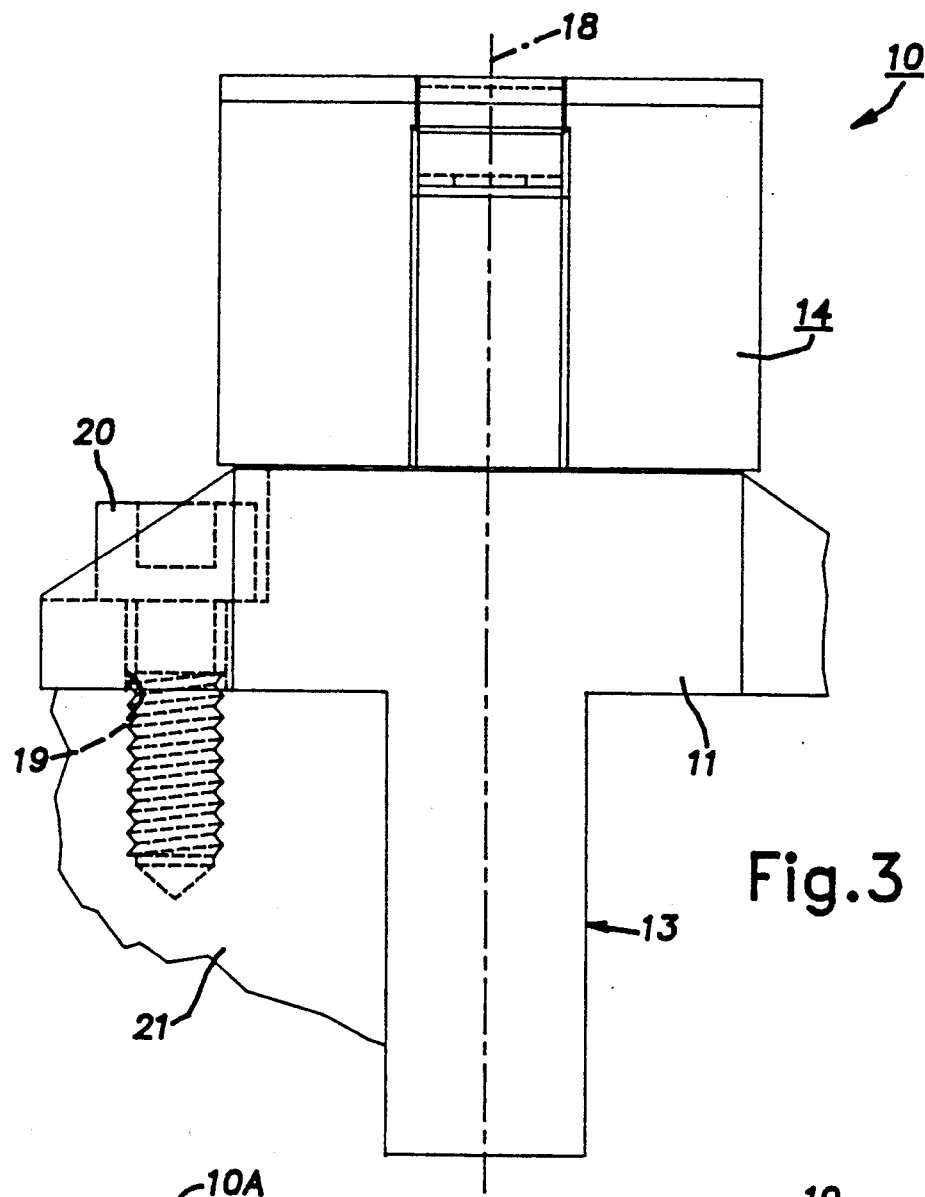
FIG. 3 is an end elevational view of the assembly.

FIGS. 1 to 3 show a proximity switch assembly 10 according to the invention. This proximity switch assembly generally has a base 11, sensing means 12 on a probe 13, an electrical cable connector 14, and conductor means extending between the sensing means 12 and the cable connector 14, the cable connector being rotatable about an axis 18 of the proximity switch assembly into a plurality of positions.

The proximity switch assembly has mounting apertures 19 on the base 11 to receive machine screws 20 for securing the base 11 to a machine 21, which has a moving part the position of which relative to the sensing means is to be determined by the proximity switch.

Figure 5:
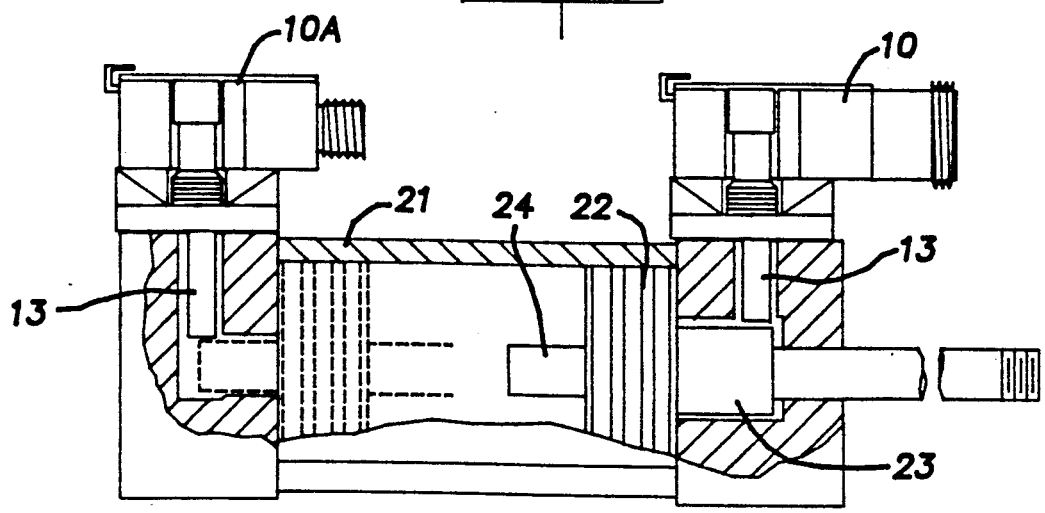
FIG. 5 is a longitudinal sectional view showing mounting of a proximity switch assembly on a hydraulic cylinder.

FIG. 5 shows a machine 21 which is a fluid cylinder with a piston 22 therein as one example of a machine having a moving part. In this case, the proximity switch determines an end position of the piston 22 relative to the cylinder 21 in a non-contact manner so that there are no moving parts of the proximity switch which are repetitively engaged by contact with the piston 22. This is one example of a machine with which the proximity switch may be used. Many machine tools require repetitive movement of moving parts, and if a contact-type switch is utilized, it often must withstand millions of actuations during its useful life. This is a big advantage of the proximity switch because there are no moving parts therein which are repetitively engaged by the moving machine part, resulting in long life.

In FIG. 5, an example is given of the piston and cylinder 21-22 as the machine with a moving part. Such piston 22 has a die cushion 23 fitting closely within an end cap of the cylinder to cushion the end of stroke movement of the piston 22. Just prior to this bottoming of the piston, the proximity switch assembly 10, with the sensing means in the end of the probe 13, will change switch states. Typically, this will control the valve which controls fluid into one end of the cylinder 21, and the piston 22 will stop or be reversed. FIG. 5 also shows a second proximity switch 10A mounted on the cap end of the cylinder 21, again with the sensing means in the probe 13 sensing the approach of a cushion spear 24 on the piston 22. This is one example of a machine with which the proximity switch assembly may be used.

In FIGS. 1, 2, and 3, the proximity switch assembly 10 is one which is compact and has a low profile, i.e., a short dimension along the axis 18. The probe 13 is constructed in many different standard lengths to suit the customer's requirements, depending upon the use to which it may be put, e.g., the various diameters of pistons and cylinders 21, 22 with which it may be used. The base 11 is preferably of metal, and may be a powdered metal or a solid steel. The probe 13 is along the axis 18, and includes a steel cylinder 27 held in place by a roll pin 28. This, in effect, gives a press fit between the roll pin and the steel cylinder, so that the cylinder 27 is held very rigidly along the axis 18 despite any side forces. The sensing means 12 in this embodiment is an electrical conductor coil mounted on a magnetizable core 30 at the distal end of the probe 13. A stud 31 of non-magnetizable material, e.g., of plastics material, has barbs 32 to fit within the inner diameter of the cylinder 27 and resist pull-out. A flange on this stud 31 has a groove 33 to receive first conductors 16 which are part of the conductor means 15. These first conductors 16 lead from the coil or sensing means 12 up through the hollow cylinder 27 to an electronic circuit 36. A sleeve 37 of non-magnetizable material, such as a plastics material, surrounds the steel cylinder 27 and has a flange 38 at the base 11. This flange has a groove to receive an O-ring 39 which makes a seal between the base 11 and the machine 21 when the base is secured on the machine 21. The sleeve 37 also has an integral end cap 40 so that the probe 37 is hermetically sealed, for example, against fluid in the machine 21-22.

The electronic circuit 36 is on a rear or second axial end of the base 11, and is within an electronic housing 44, preferably of metal. This electronic housing is cylindrical and has a press fit into an aperture 45 at the rear axial end of the base 11. The electronic circuit 36 in this preferred embodiment is shown mounted on three separate circuit boards 46, and may consist of an oscillator or amplifier, or both, to energize the sensing coil 12 and to determine when the coil 12 is within sensing range of the movable machine part. When the movable part comes within range, the proximity switch changes state from ON to OFF, or from OFF to ON. This change of switch state is conducted on second conductors 17 to the electrical cable connector 14.

Figure 4:
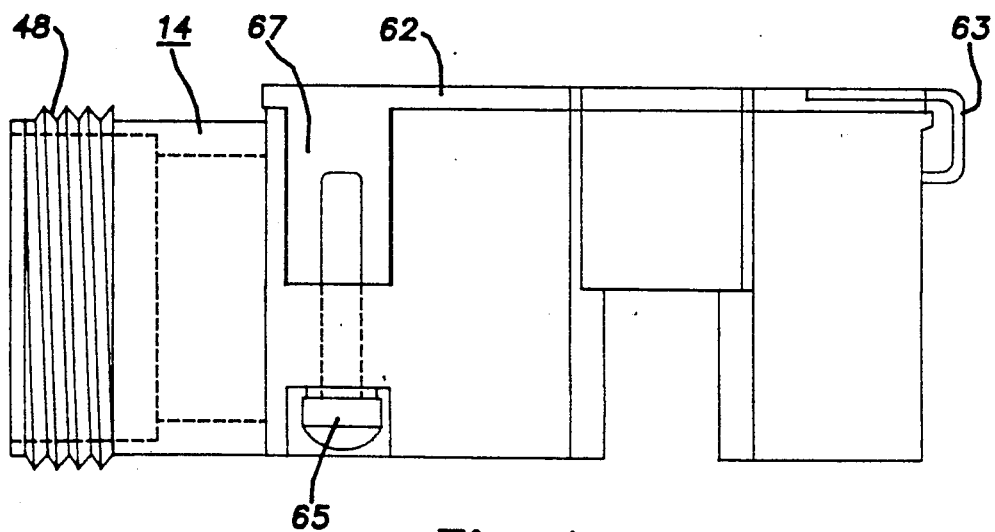
FIG. 4 is a side elevational view of the cable connector on line 4—4 of FIG. 1.

The cable connector 14 is shown by itself in FIG. 4, and is shown assembled into the proximity switch 10 in FIGS. 1-3. The cable connector may be one with a cable integrally attached; however, it is shown in FIGS. 1-4 as having a threaded coupling 48 for selective connection to a threaded plug (not shown) which connects to terminal pins 49. The inner ends of these terminal pins 49 are connected to the second conductors 17. FIGS. 1 and 2 show that the second conductors 17 are spiralled around a barrel 51 of an end cap 52. The barrel 51 may hold indicator lamps such as LED's to indicate when the power is on and to indicate when the switch has been actuated. The end cap 52 may preferably be made from a plastics material. An O-ring 53 is used to generally seal the electronic housing 44 to the cable connector 14, and more specifically to a sleeve 54 which is part of the cable connector 14 and which coaxially surrounds the electronic housing 44. Drain holes 55 are provided through the electronic housing 44 to drain off any possible moisture above the end cap 52.

The cylindrical electronic housing 44 and cylindrical sleeve 54 establish rotation of the cable connector relative to the base about said axis into a plurality of positions.

The plurality of positions of the cable connector is established by a plurality of teeth 58 relative to a locking device 59. In the preferred embodiment, the teeth 58 are on the rear axial end of the electronic housing 44 which is secured to the base 11, and the locking device 59 is connected to the cable connector 14. The plural teeth 58 extend parallel to the axis 18, and the locking device 59 is a cantilever leaf spring which has a narrow neck 60 to fit between two adjacent teeth. This locking device 59 is shown broken away in FIG. 1 in order to avoid confusion with other parts of the drawing, and in fact a cover 62, shown in FIG. 2, is not shown in FIG. 1 in order to show the teeth 58. The locking spring 59 has an inherent bias toward the teeth 58, and may be raised by a manual handle 63 or by a tool 64, such as a screwdriver. The cover 62 is held in place by two machine screws 65 which are threaded into posts 67 which are part of the cover 62. One of the teeth 58 is considered an abutment tooth 66, and is longer than the rest of the teeth so as to limit rotation of the cable connector to about 330 degrees, which is essentially one full revolution.

The voids within the sensing means 12, steel cylinder 27, stud 31, and electronic circuit to the end cap 52 are preferably filled with a castable synthetic resin 61. This may also enter the barrel 51 to hold in place the two LED's. The second conductors 17 pass through the end cap at apertures 68 shown in FIG. 1, and this castable synthetic resin will seal around the second conductors and the apertures. Additionally, a castable synthetic resin 69 is filled inside the rear end of the cable connector 14 to cover the rear end of the terminal pins 49 and their connection to the second conductors 17. However, the spiral of the second conductors is left open to the air so that this spiral may readily be loosened or tightened as the cable connector is rotated around the axis into any one of the plurality of positions.

In operation, the proximity switch is mounted to a machine, such as cylinder 21, in order to determine the position of a movable part of the machine such as the piston 22. Upon approach of the target, the proximity switch changes state from ON to OFF, or from OFF to ON. The machine with which the proximity switch may be used may have 3,000 psi operating pressure, for example, and the present proximity switch is intended to operate under such conditions, including 12,000 psi peak test pressure. The sleeve 37 hermetically seals the sensing means 12 in the probe 13. The steel cylinder 27 provides strength and rigidity to the probe so that any side forces such as bumping or dropping of the switch are readily absorbed without damage. The castable resin 61 fills all the voids inside the probe, the sensing means 12, the stud 31, steel cylinder 27, and electronic housing 44, and even includes any space between the sleeve 37 and the steel cylinder 27. This filling of the voids makes a solid, rigid probe 13 which will readily withstand 3,000 psi on the end cap 40, and even withstand 12,000 psi peak pressure for testing purposes. The fact that the steel cylinder has a distal end extending closely adjacent the sensing coil 12 means that as the temperature rises during use, the probe extends in length essentially the same as the machine part to which it is connected, and therefore the clearance between the end of the probe and the moving machine part remains essentially the same. If this probe were made from a plastic material, the rate of expansion could be considerably different between it and a metal machine so that the clearance would change drastically, and might even change so much that the probe was out of sensing range. Since the probes have many different standard lengths depending upon customer requirements, it is not always predeterminable how much clearance there will be between the end of the probe and the moving part. The fact that the cylinder 27 is made of steel inhibits this change in clearance between the probe and the moving part.

The stud 31 is pressed into place with the barbs 32 holding the stud in position and then, after the castable resin is used to fill the voids, this stud takes up all tolerances in the length dimensions as it is assembled.

The conductor means includes the first and second conductors 16 and 17, and in the construction shown, this conductor means is spiralled so that loosening or tightening of the spiral permits rotational adjustment of the cable connector 14 relative to the sensing means 12. In this preferred embodiment, it is the second conductors 17 which are spiralled. The fact that the probe sleeve 37 has the flange 38 which is of relatively small diameter and the O-ring 39 is of relatively small diameter aids in the effective sealing of the high pressure in the machine 21-22. This probe 13 does not rotate during the selective placement of the cable connector 14. The base may be securely mounted to the machine and later the cable connector 14 may be oriented in any desired position for the best routing of the cable. The locking device has a default setting, i.e., it is a spring-urged locking device and manually released. Should the spring inadvertently be left sitting on top of one of the teeth 58, then the cable connector will not be immediately locked, but as soon as it is bumped or moved slightly, the narrow neck 60 will drop between two adjacent teeth to lock the cable connector into one of the plurality of positions.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and the scope of the invention as hereinafter claimed.

What is claimed is:

1. A proximity switch assembly having at least "ON" and "OFF" switch states, and comprising:
    a base having a longitudinal axis;
    sensing means mounted non-rotatably on a front axial end of said base for controlling the switch states;
    mounting means in said base for securing said base to a machine having a moving part, the position of said moving part relative to said sensing means being determined by said switch states;
    an electrical cable connector on said base extending perpendicularly to said axis whereby said proximity switch may be operatively associated electrically with said moving part;
    conductor means extending between said non-rotatable sensing means and said electrical cable connector;
    means establishing rotation of said cable connector relative to said base about said axis into a plurality of positions; and
    at least part of said conductor means being deformed spirally to permit rotation between limits of said cable connector around said axis by tightening or loosening said spiral.

2. A proximity switch assembly as set forth in claim 1, including an electronic housing on a rear axial end of said base; and
    said conductor means including first conductors between said sensing means and said electronic housing and second conductors between said electronic housing and said electrical cable connector.

3. A proximity switch assembly as set forth in claim 2, including a seal cap in the rear axial end of said electronic housing; and
    a castable synthetic resin filling the voids within said probe, electronic housing, and up to said plastics seal cap.

4. A proximity switch assembly as set forth in claim 1, including a probe of predetermined length coaxial with said base and mounted on a front axial end of said base; and
    said sensing means being mounted on a distal end of said probe.

5. A proximity switch assembly as set forth in claim 4, including a steel cylinder coaxial within said probe and secured to the front axial end of said base, said steel cylinder having a distal end in close proximity to said sensing means.

6. A proximity switch assembly as set forth in claim 5, including a sleeve of plastic material on said probe surrounding said steel cylinder and having a flange disposed in an annular recess in the front face of said base.

7. A proximity switch assembly as set forth in claim 6, including sealing means between said plastic sleeve flange and the machine to which the base is mountable.

8. A proximity switch assembly as set forth in claim 7, including an integral end cap on said sleeve at the distal end of said probe.

9. A proximity switch assembly as set forth in claim 1, wherein said rotation establishing means includes a surface on said base with a circular cross section coaxial with said axis.

10. A proximity switch assembly as set forth in claim 9, including a sleeve connected to said cable connector and surrounding said surface.

11. A proximity switch assembly as set forth in claim 1, including a stop for said rotation establishing means to limit rotation of said cable connector to approximately 360 degrees of arc.

12. A proximity switch assembly having at least "ON" and "OFF" switch states, and comprising, in combination:
    a base having a longitudinal axis;
    sensing means mounted on a front axial end of said base;
    mounting means in said base for securing said base to a machine having a moving part, the position of said moving part relative to said sensing means being determined by said switch states;
    an electrical cable connector on said base electrically connected to said sensing means and extending at an angle to said axis;

means establishing rotation of said cable connector relative to said base about said axis into a plurality of positions;

a series of teeth around said axis and equidistant therefrom; and a locking device movable into engagement with any of said teeth to establish one of a plurality of locked rotational positions of said cable connector relative to said base.

13. A proximity switch assembly as set forth in claim 12, wherein one of said teeth and said locking device is connected to said base and the other to said cable connector.

14. A proximity switch assembly as set forth in claim 12, wherein said sensing means is mounted non-rotatably on said base.

15. A proximity switch assembly as set forth in claim 14, wherein said electrical connection between said sensing means and said cable connector permits at least limited rotation between said sensing means and said cable connector.

16. A proximity switch assembly as set forth in claim 12, wherein said cable connector extends perpendicularly to said axis.

17. A proximity switch assembly as set forth in claim 12, wherein said teeth are connected to said base and said locking device is connected to said cable connector.

18. A proximity switch assembly as set forth in claim 17, wherein said teeth extend parallel to said axis, and wherein said locking device has movement parallel to said axis.

19. A proximity switch assembly as set forth in claim 12, wherein one of said teeth is longer than the others to act as a rotational stop for limited rotation of less than 360 degrees to said cable connector.

20. A proximity switch assembly as set forth in claim 12, including means urging said locking device into engagement with said teeth.

21. A proximity switch assembly as set forth in claim 20, including manual means to activate said urging means in a direction out of engagement with said teeth to permit rotation of said cable connector.

* * * * *